United States Patent
Tian et al.

(10) Patent No.: US 10,534,233 B2
(45) Date of Patent: Jan. 14, 2020

(54) ARRAY SUBSTRATE, METHOD FOR MANUFACTURING THE SAME, DISPLAY DEVICE

(71) Applicants: BOE TECHNOLOGY GROUP CO., LTD., Beijing (CN); Chongqing BOE Optoelectronics Technology Co., Ltd., Chongqing (CN)

(72) Inventors: Maokun Tian, Beijing (CN); Zhonghao Huang, Beijing (CN); Xu Wu, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/941,271

(22) Filed: Mar. 30, 2018

(65) Prior Publication Data

US 2019/0086755 A1    Mar. 21, 2019

(30) Foreign Application Priority Data

Sep. 19, 2017 (CN) .......................... 2017 1 0845982

(51) Int. Cl.
*G02F 1/1362*    (2006.01)
*G02F 1/1333*    (2006.01)
(Continued)

(52) U.S. Cl.
CPC .... *G02F 1/136286* (2013.01); *G02F 1/13439* (2013.01); *G02F 1/133345* (2013.01);
(Continued)

(58) Field of Classification Search
CPC ......... G02F 1/133345; G02F 1/136227; G02F 1/136286; H02F 1/13439; H01L 27/124
See application file for complete search history.

(56) References Cited

U.S. PATENT DOCUMENTS 9,523,895 B2 * 12/2016 Li ........................... H01L 27/12
9,570,473 B2 *  2/2017 Wang .................. G02F 1/13458
(Continued)

FOREIGN PATENT DOCUMENTS

CN        1653508 A     8/2005
CN      102820319 A    12/2012
(Continued)

OTHER PUBLICATIONS

First Office Action for Chinese Patent Application No. 201710845982.8 dated Aug. 1, 2019.

*Primary Examiner* — Earl N Taylor
(74) *Attorney, Agent, or Firm* — Calfee, Halter & Griswold LLP

(57) ABSTRACT

The present disclosure provides an array substrate, a method for manufacturing the same, and a display device, which belongs to the field of display technology. The array substrate includes a metal electrode layer, a pad layer, a first insulating layer and a first transparent conductive layer, wherein: the pad layer includes a transparent conductive material, the metal electrode layer includes a conductive layer and protection layers formed on both surfaces of the conductive layer, and the pad layer is connected to the metal electrode layer; the first insulating layer is covered on the metal electrode layer and the pad layer, and the first transparent conductive layer is disposed on the first insulating layer; and a via hole is provided in the first insulating layer, and the first transparent conductive layer is connected to the pad layer through the via hole.

16 Claims, 6 Drawing Sheets

(51) Int. Cl.
   *H01L 27/12* (2006.01)
   *G02F 1/1343* (2006.01)
(52) U.S. Cl.
   CPC ...... *G02F 1/136227* (2013.01); *H01L 27/124* (2013.01); *G02F 2201/121* (2013.01); *G02F 2201/123* (2013.01)

(56) References Cited

U.S. PATENT DOCUMENTS

| | | | | |
|---|---|---|---|---|
| 9,799,642 | B2* | 10/2017 | Zhang | H01L 27/1214 |
| 9,831,178 | B2* | 11/2017 | Feng | G02F 1/136227 |
| 2008/0030671 | A1* | 2/2008 | You | G02F 1/133555 |
| | | | | 349/187 |
| 2010/0025675 | A1* | 2/2010 | Yamazaki | H01L 29/66742 |
| | | | | 257/43 |
| 2011/0013106 | A1* | 1/2011 | Liu | G02F 1/136286 |
| | | | | 349/46 |
| 2011/0284836 | A1* | 11/2011 | Lee | H01L 29/45 |
| | | | | 257/43 |
| 2013/0029446 | A1* | 1/2013 | Kim | H01L 27/124 |
| | | | | 438/34 |
| 2013/0248850 | A1* | 9/2013 | Choi | H01L 29/66969 |
| | | | | 257/43 |
| 2014/0175442 | A1* | 6/2014 | Kwack | H01L 27/124 |
| | | | | 257/59 |
| 2015/0206979 | A1* | 7/2015 | Shimada | H01L 27/1225 |
| | | | | 257/43 |
| 2015/0214320 | A1* | 7/2015 | Liu | H01L 29/45 |
| | | | | 257/43 |
| 2016/0013325 | A1* | 1/2016 | Kitakado | H01L 29/45 |
| | | | | 257/43 |
| 2016/0056297 | A1* | 2/2016 | Yu | H01L 21/823418 |
| | | | | 257/43 |
| 2016/0329353 | A1* | 11/2016 | Goto | G02F 1/1368 |
| 2018/0090617 | A1* | 3/2018 | Youn | H01L 21/02164 |
| 2018/0108780 | A1* | 4/2018 | Li | H01L 21/02664 |
| 2019/0019816 | A1* | 1/2019 | Kang | H01L 27/124 |
| 2019/0086755 | A1* | 3/2019 | Tian | G02F 1/136286 |

FOREIGN PATENT DOCUMENTS

| | | |
|---|---|---|
| CN | 103579219 A | 2/2014 |
| CN | 105304646 A | 2/2016 |
| WO | 2017024882 A1 | 2/2017 |

* cited by examiner

ARRAY SUBSTRATE, METHOD FOR MANUFACTURING THE SAME, DISPLAY DEVICE

CROSS REFERENCE

The present application claims the priority of Chinese Patent Application No. 201710845982.8, filed on Sep. 19, 2017, and the entire contents thereof are incorporated herein by reference as part of the present application.

TECHNICAL FIELD

The present disclosure relates to the field of display technology, and in particular, to an array substrate, a method for manufacturing the same, and a display device.

BACKGROUND

In a conventional display device, high conductivity materials such as copper, aluminum and the like have gradually replaced the traditional materials and become the preferred body material for the metal electrodes. A major technology facilitating the above change is the use of protection layer, i.e., by forming protection layers on both sides of the copper layer or aluminum layer using materials with more stable materials such as molybdenum, niobium or the like, it is possible to prevent atom diffusion, prevent oxidation of materials, improve surface properties and improve contact resistance. However, the above change may cause new problems in the conventional manufacturing process. During the processes of etching via holes and connecting electrodes, the etching is generally performed to a depth exceeding the depth of the via hole with reference to the deepest via hole, to prevent any partial under-etching of the via hole. While particularly in the scheme of using the copper electrode or aluminum electrode, the above over etching process may cause etching damage to the protection layer. If the protection layer at the bottom of the via hole is penetrated by the etching, the copper or aluminum without protection may undergo diffusion or oxidation, resulting in a very large contact resistance or even an open circuit at the via hole. Currently, in order to protect the protection layer from been penetrated by over etching, the thickness of the upper protection layer is significantly increased, which results in not only increasing the consumption of the target material and the time for forming the film, but also increasing the overall thickness of the substrate and steps in the structure, thereby causing various problems regarding cost, the productivity and element performance.

It should be noted that, information disclosed in the above background portion is provided only for better understanding of the background of the present disclosure, and thus it may contain information that does not constitute the prior art known by those ordinary skilled in the art.

SUMMARY

The present disclosure provides an array substrate, a method for manufacturing the same, and a display device.

According to an aspect of the present disclosure, there is provided an array substrate, including a metal electrode layer, a pad layer, a first insulating layer and a first transparent conductive layer, wherein:

the pad layer includes a transparent conductive material, the metal electrode layer includes a conductive layer and protection layers formed on both surfaces of the conductive layer, and the pad layer is connected to the metal electrode layer;

the first insulating layer is covered on the metal electrode layer and the pad layer, and the first transparent conductive layer is disposed on the first insulating layer; and a via hole is provided in the first insulating layer, and the first transparent conductive layer is connected to the pad layer through the via hole.

In a possible implementation, the metal electrode layer is disposed in a first region outside of a second region in which the via hole is disposed, and the first transparent conductive layer is connected to the metal electrode layer through the pad layer disposed between the via hole and the metal electrode layer.

In a possible implementation, the metal electrode layer is disposed in a first region outside of a third region in which the first transparent conductive layer is disposed, and the first transparent conductive layer is connected to the metal electrode layer through the pad layer disposed between the first transparent conductive layer and the metal electrode layer.

In a possible implementation, the via hole is disposed in a second region within a first region in which the metal electrode layer is disposed, and the first transparent conductive layer is connected to the metal electrode layer through the pad layer disposed beneath the via hole.

In a possible implementation, the array substrate further includes a second transparent conductive layer, wherein the first insulating layer is covered on the second transparent conductive layer, and the pad layer and the second transparent conductive layer are formed in one patterning process.

In a possible implementation, the array substrate further includes a gate conducive layer, a gate insulating layer and an active layer;

the metal electrode layer is connected to the active layer, and all of the metal electrode layer, the active layer and the second transparent conductive layer are disposed on the gate insulating layer; and the gate conductive layer is overlapped with the active layer, and the gate insulating layer is covered on the gate conductive layer.

In a possible implementation, the array substrate further includes a source/drain conductive layer and an active layer, the metal electrode layer includes a common voltage line and a gate electrode, and the first insulating layer includes a gate insulating layer and a passivation layer;

the common voltage line is connected to the pad layer, the gate insulating layer is covered on the metal electrode layer, the pad layer and the second transparent conductive layer;

the active layer is overlapped with the gate electrode, and the source/drain conductive layer is connected to the active layer;

the passivation layer is covered on the gate insulating layer, the source/drain conductive layer, and the active layer; and the first transparent conductive layer is disposed on the passivation layer, a via hole is formed in the gate insulating layer and the passivation layer, and the first transparent conductive layer is connected to the pad layer through the via hole.

In a possible implementation, the conductive layer includes aluminum, copper, an aluminum-containing alloy or a copper-containing alloy, and the protection layer includes molybdenum, niobium, a molybdenum-containing alloy or a niobium-containing alloy.

According to an aspect of the present disclosure, the present disclosure further provides a method for manufacturing an array substrate, including:

forming a first pattern including a metal electrode layer, the metal electrode layer including a conductive layer and protection layers formed on both surfaces of the conductive layer;

forming a second pattern including a pad layer, the pad layer being connected to the metal electrode layer;

forming a first insulating layer covered on the metal electrode layer and the pad layer;

forming a via hole in the first insulating layer; and forming a third pattern including a first transparent conductive layer on the first insulating layer, the first transparent conductive layer being connected to the pad layer through the via hole.

In a possible implementation, the metal electrode layer is disposed in a first region outside of a second region in which the via hole is disposed, and the first transparent conductive layer is connected to the metal electrode layer through the pad layer disposed between the via hole and the metal electrode layer.

In a possible implementation, the via hole is disposed in a second region within a first region in which the metal electrode layer is disposed, and the first transparent conductive layer is connected to the metal electrode layer through the pad layer disposed beneath the via hole.

According to an aspect of the present disclosure, there is further provided a display device including any one of the above array substrate.

It is to be understood that both the foregoing general description and the following detailed description are exemplary and explanatory only and are not restrictive of the present disclosure, as claimed.

This section provides a summary of various implementations or examples of the technology described in the present disclosure, and is not a comprehensive disclosure of the full scope or all features of the disclosed technology.

BRIEF DESCRIPTION OF THE DRAWINGS

Drawings used for describing embodiments of the present disclosure will be introduced briefly hereinafter to further clearly describe the implementations of the embodiments of the present disclosure. Apparently, the accompanying drawings in the following description show merely some embodiments of the present disclosure, and reasonable modifications of these accompanying drawings also fall within the protection scope of the present disclosure.

DETAILED DESCRIPTION

Hereinafter, embodiments of the present disclosure will now be described more fully with reference to the accompanying drawings, to further clarify the objective, the technical solutions and advantages of the present disclosure. Apparently, the described embodiments are merely some embodiments of the present disclosure instead of all the embodiments of the present disclosure. On the basis of the described embodiment of the present disclosure, all the embodiments obtained by those skilled in the art without creative labor will fall within the protection scope of the present disclosure. Unless been defined otherwise, technical terms or scientific terms used in the present disclosure should be interpreted in the ordinary sense to those having ordinary skill in the art to which this disclosure belongs. The terms "first," "second," and similar terms used in the present disclosure do not denote any order, quantity or importance, but merely serve to distinguish different components. "Including" or the like indicates that the element or item preceding the word covers elements or items that appear after the word and their equivalents, but do not exclude other elements or items.

Figure 1:
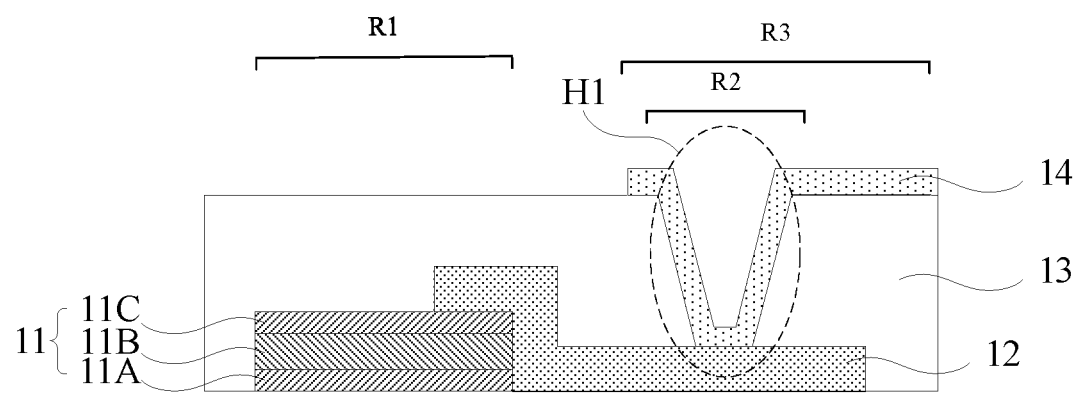
FIG. 1 is a schematic diagram of an array substrate provided in an embodiment of the present disclosure.

FIG. 1 is a schematic diagram of an array substrate provided in an embodiment of the present disclosure. Referring to FIG. 1, the array substrate includes a metal electrode layer 11, a pad layer 12, a first insulating layer 13 and a first transparent conductive layer 14. In the embodiment, the metal electrode layer 111 includes a conductive layer 11B and a lower protection layer 11A and an upper protection layer 11C formed respectively on both surfaces of the conductive layer 11B, all these layers are formed of metal material. The pad layer 12 includes a transparent conductive material, and the pad layer 12 is connected to the metal electrode layer 11. The first insulating layer 13 is covered on the metal electrode layer 11 and the pad layer 12, and the first transparent conductive layer 14 is disposed on the first insulating layer 13. A via hole H1 is provided in the first insulating layer 13, and the first transparent conductive layer 14 is connected to the pad layer 12 through the via hole H1. It should be appreciated that the pad layer 12 formed of transparent material is connected to the first transparent conductive layer 14 and the metal electrode layer 11, respectively, thereby forming an electrical connection between the first transparent conductive layer 14 and the metal electrode layer 11.

It should be further appreciated that when it is required to form the via hole H1 by etching in the first insulating layer 13, the metal electrode layer 11 will not be affected by the etching at all under the blockage of the first insulating layer 13 and the pad layer 12. Moreover, since the transparent conductive material is substantially more resistant to etching than the metallic material, the surface damage suffered by the pad layer 12 in the event of over-etching is much less than that of the metallic material under the same conditions. In addition, there may be a small contact resistance between the pad layer 12 and the first transparent conductive layer 14 both formed of transparent conductive material (especially when the two are made of the same material), and the connection characteristics between the metal electrode layer 11 and the pad layer 12 are easily ensured technically.

Based on the above aspects, in the case where it is required to connect the metal electrode layer with the protection layer through the via hole using the first transparent conductive layer, embodiments of the present disclosure provide a means for avoiding serious damage to the protection layer during via etching while obtaining good connection reliability. In the case where the display device includes the copper electrode or the aluminum electrode with the conductive layer formed of copper or aluminum, embodiments of the present disclosure can solve the problem that the electrode protection layer thereof may be seriously damaged during the etching of the via hole. Compared with the method of increasing the thickness of the protection layer to avoid the penetration of the protection layer, embodiments of the present disclosure can significantly reduce the required thickness of the protection layer, avoid the formation of large contact resistance, save cost and increase productivity, and achieve better product performance.

It should be noted that FIG. 1 is merely an exemplary structure of an array substrate according to an embodiment of the present disclosure. Exemplarily, the illustrated aspects include, but are not limited to, the following aspects:

Firstly, with respect to the connection between the metal electrode layer 11 and the pad layer 12, in addition to the connection of the pad layer 12 being covered on at least part of the edge of the metal electrode layer 11 as shown in FIG. 1, other connections manners, such as the metal electrode layer 11 being covered on at least part of the edge of the pad layer 12, or the pad layer 12 being covered entirely on the metal electrode layer 11, are also possible, and the present disclosure is not limited thereto. In addition, the metal electrode layer 11 may be disposed on the pad layer 12, and the pad layer 12 may also be disposed on the metal electrode layer 11. When the pad layer 12 and the metal electrode layer 11 can be electrically connected to each other, they may be disposed in the same layer.

Secondly, the first insulating layer 13 may be, for example, a combination of two insulating layers and a structure located between the two insulating layers, in addition to the single layer structure entirely made of an insulating material as shown in FIG. 1, and the via hole H1 may pass through two or more insulating layers.

Thirdly, the array substrate may further include other structures not shown in FIG. 1, for example, at least one of the following structures: an insulating layer covering on the first transparent conductive layer 14, an insulating layer or a substrate disposed under the metal electrode layer 11 and the pad layer 12, and another metal electrode layer provided in the same layer as the first transparent conductive layer 14. Of course, the structure that the array substrate may include may not be limited thereto.

Figure 2:
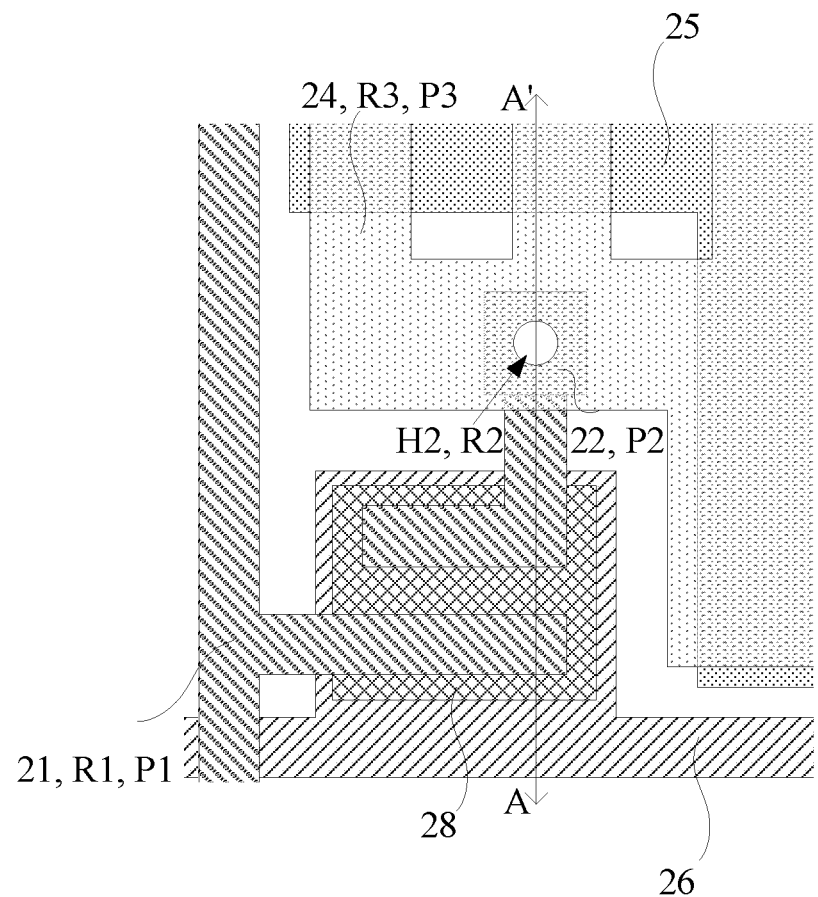
FIG. 2 is a plan structural view of an array substrate provided in an embodiment of the present disclosure.
Figure 3:
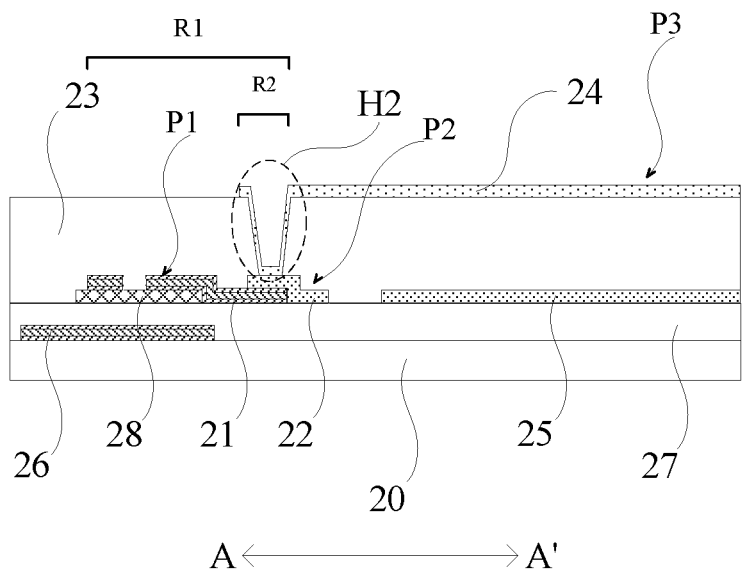
FIG. 3 is a cross sectional view taken along A-A' of the array substrate illustrated in FIG. 2.

FIG. 2 is a plan structural view of an array substrate provided in an embodiment of the present disclosure, and FIG. 3 is a cross sectional view taken along A-A' of the array substrate illustrated in FIG. 2. Referring to FIGS. 2 and 3, the array substrate according to the present embodiment includes a substrate 20, a metal electrode layer 21, a pad layer 22, a first insulating layer 23, a first transparent conductive layer 24, a second transparent conductive layer 25, a gate conductive layer 26, a gate insulating layer 27 and an active layer 28. It should be noted that in order to show the shapes of the other layer structures, the substrate 20, the first insulating layer 23 and the gate insulating layer 27 are not shown in FIG. 2.

Referring to FIGS. 2 and 3, the metal electrode layer 21 includes a conductive layer and a lower protection layer and an upper protection layer respectively disposed on both surfaces of the conductive layer. The gate conductive layer 26 also includes a conductive layer and a lower protection layer and an upper protection layer respectively disposed on both surfaces of the conductive layer. The conductive layer and the protection layer are formed of a metal material. The pad layer 22 is connected to the metal electrode layer 21. The first insulating layer 23 is covered on the metal electrode layer 21, the pad layer 22 and the second transparent conductive layer 25. The first transparent conductive layer 24 is disposed on the first insulating layer 23. The first insulating layer 23 is provided with a via hole H2. The first transparent conductive layer 24 is connected to the pad layer 22 through the via hole H2. It should be appreciated that the pad layer 22 formed of a transparent conductive material is connected to the first transparent conductive layer 24 and the metal electrode layer 21, respectively, so that the electrical connection between the first transparent conductive layer 24 and the metal electrode layer 21 can be formed. In addition, there is a connection between the metal electrode layer 21 and the active layer 28, and the metal electrode layer 21, the active layer 28 and the second transparent conductive layer 25 are all disposed on the gate insulating layer 27. The gate conductive layer 26 and the active layer 28 overlap with each other, and the gate insulating layer 26 is covered on the gate conductive layer 26.

Based on the above structure, in FIGS. 2 and 3, a conductive channel can be formed in the active layer 28 between locations where the active layer 28 is respectively connected to the two patterns in the metal electrode layer 21. The magnitude of the current flowing in the conductive channel can be influenced by the magnitude of the voltage applied by the gate conductive layer 26 thereunder. That is, a thin film transistor having a gate electrode in the gate conductive layer 26, a source electrode and a drain electrode in the metal electrode layer 21, and an active region in the active layer 28 can be formed. Hereinafter, for convenience of description, one of the two patterns connected to the active layer 28 in the metal electrode layers 21 that is connected to the pad layer 22 is referred to as a drain pattern, and the other one is referred to as a source pattern. It should be understood that the source electrode and the drain electrode of the thin film transistor in practical applications should be configured and determined according to factors such as the transistor type and the circuit connection relationship. Referring to FIG. 2, the thin film transistor can receive a gate voltage to be loaded through a gate line extending in a lateral direction in the gate conductive layer 26 and a source voltage to be loaded through a longitudinally extending data line in the metal electrode layer 21.

In FIG. 2, a pattern of pixel electrodes as strip electrodes (or grid electrodes) in the first transparent conductive layer 24 and a pattern of the common electrode as a plate electrode (or a flat electrode) in the second transparent conductive layer 25 are shown. Referring to FIGS. 2 and 3, the pixel electrode is connected to the pad layer 22 through the via hole H2, and then connected to the drain electrode of the thin film transistor. Therefore, when the thin film transistor operates in the linear region and the saturation region, a voltage substantially equal to the source voltage can be applied to the pixel electrode through the current flowing in the conductive channel. The common electrode is connected to a common voltage (not shown in FIGS. 2 and 3) by a structure such as a common electrode line. Accordingly, based on the voltage difference between the pixel electrode and the common electrode, it is possible to form an electric filed in the space around the two electrodes that are capable of orientating the liquid crystal molecules in the electric field according to the expected manner.

Figure 4:
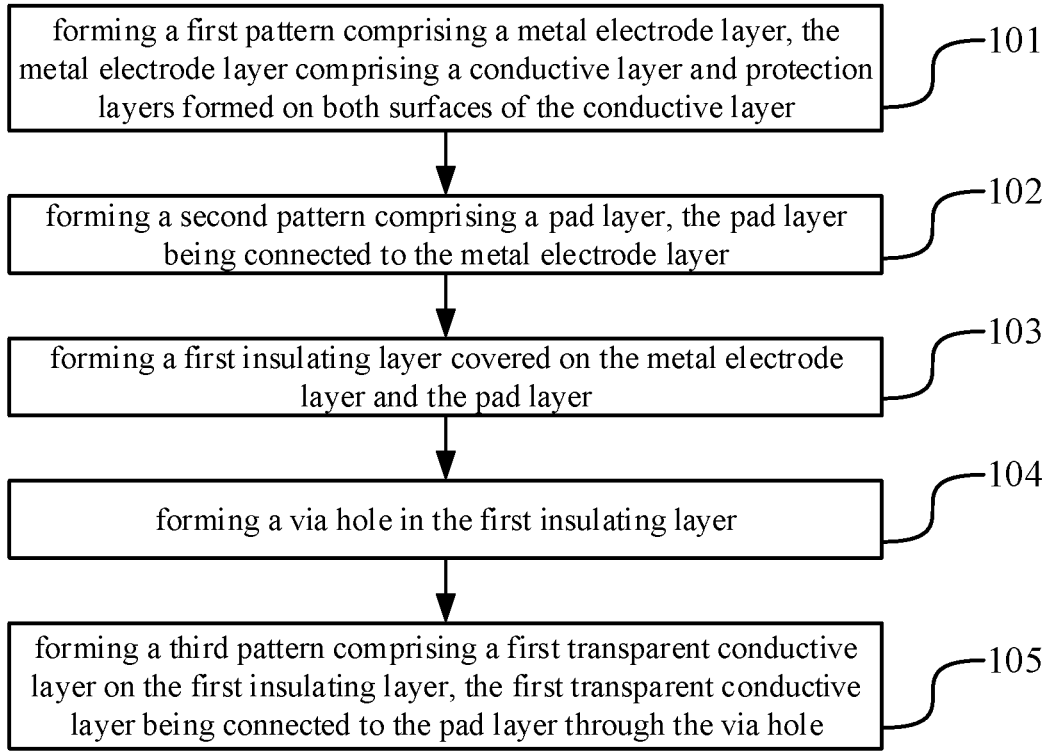
FIG. 4 is a flow chart illustrating a method for manufacturing an array substrate provided in an embodiment of the present disclosure.

FIG. 4 is a flow chart of a method for manufacturing an array substrate according to an embodiment of the present disclosure. The array substrate of the embodiment of the present disclosure, such as the array substrate shown in FIGS. 1, 2 and 3 can be manufactured by the flow chart shown in FIG. 4. Referring to FIG. 4, the method for manufacturing the array substrate may include the following processes.

Step 101, a first pattern including a metal electrode layer is formed, the metal electrode layer including a conductive layer and protection layers formed on both surfaces of the conductive layer.

Step 102, a second pattern including a pad layer is formed, the pad layer being connected to the metal electrode layer.

Step 103, a first insulating layer is formed, the first insulating layer being covered on the metal electrode layer and the pad layer.

Step 104, a via hole is formed in the first insulating layer.

Step 105, a third pattern including a first transparent conductive layer is formed on the first insulating layer, the first transparent conductive layer being connected to the pad layer through the via hole.

For example, the method for manufacturing the array substrate illustrated in FIGS. 2 and 3 may further include, prior to the step 101, the following steps that are not shown in FIG. 4.

Step 100A, a pattern including the metal electrode layer is formed on the substrate.

In an example, the lower protection layer, the conductive layer and the upper protection layer of the gate conductive layer 26 which is not patterned may be deposited successively on the surface of the substrate 20 using a physical vapor deposition (PVD) process of a metal material. Parameters such as film thickness can be set by, for example, adjusting the relevant process parameters. On this basis, the entirely overlaid metal layer is patterned. For example, a layer of photoresist is coated on the unpatterned gate conductive layer 26 by using a spin-on method (an example of a positive photoresist is illustrated herein). Ultraviolet light is used to irradiate all the photoresist in the area to be etched through the mask plate to fully expose the photoresist. The resulted structure is then placed in a developing solution to remove all the photoresist in the area to be etched by developing, and the remaining photoresist is used as a mask to etch the three metal layers. After completing the etching, the remaining photoresist is removed to finally form a pattern of the gate conductive layer 26 shown in FIG. 2 and FIG. 3.

In the present embodiment, the substrate 20 may include for example a glass substrate, a silicon wafer, or an organic polymer material such as polyimide. The conductive layer in the gate conductive layer 26 may be selected from metal materials whose conductivity satisfy the requirement such as copper, aluminum, copper-containing alloys, aluminum-containing alloys, and the like. The protection layer in the gate conductive layer 26 may be selected from metal materials having required stability such as molybdenum, niobium, a molybdenum-containing alloy, a niobium-containing alloy, or other metallic material that is mainly composed of an inert metal element.

Step 100B, a gate insulating layer is formed, the gate insulating layer being covered on the substrate and the metal electrode layer.

In an example, the step includes depositing a gate insulating layer 27 covering the substrate 20 and the gate conductive layer 26 by chemical vapor deposition (CVD) over the substrate 20 and the gate conductive layer 26. The film thickness of the gate insulating layer 27 may need to meet the relevant requirements for the thickness of the gate insulating layer of the thin film transistor. Parameters such as film thickness can be set by, for example, adjusting the relevant process parameters. In the present embodiment, the gate insulating layer may include silicon oxide, silicon nitride, photoresist, organic polymer material, or the like, and can be fabricated with reference to the manufacturing method of the gate insulating layer of other thin film transistors.

Step 100C, a pattern including the active layer is formed on the gate insulating layer.

In one embodiment, a layer of semiconductor material may be first formed by, for example, a chemical vapor deposition process, and then the active layer 28 having a desired pattern may be formed through a patterning process and a doping process such as ion implantation. In the present embodiment, the active layer 28 and the gate conductive layer 26 overlap with each other. In the present embodiment, the active layer may include a semiconductor material such as amorphous silicon, polysilicon, monocrystalline silicon, a metal oxide semiconductor, or the like. The material can be determined according to the type and the device parameters of the thin film transistor to be formed, and details are not repeated herein.

On the basis of the intermediate product obtained after the above step 100A, step 100B and step 100C, in the above step 101, the unpatterned metal electrode layer 21 may be patterned in the same manner as the forming of the gate conductive layer 26. When the metal electrode layer 21 and the gate conductive layer 26 include the same material and have the same film structure, the main difference between the two in the process may lie only in the different patterns of the mask plate used when the photoresist is irradiated with ultraviolet light through the mask plate.

On the basis of the intermediate product obtained after the above step 101, a layer of transparent conductive material is formed in the above step 102 by, for example, a chemical vapor deposition process, and then patterned to form the pad layer 22 and the second transparent conductive layer 25 as shown in FIG. 2 and FIG. 3. That is, the pad layer and the second transparent conductive layer may be formed in a patterning process (including the process of deposition and patterning) of the same transparent conductive material. In the present embodiment, the transparent conductive material may be, for example, a material that satisfies the application requirements for the light transmission and the conductivity such as indium tin oxide (ITO).

On the basis of the intermediate product obtained after the above step 102, in the above step 103, the process of depositing the first insulating layer 23 covering the gate insulating layer 27, the active layer 28 and the metal electrode layer 28 may be performed by the chemical vapor deposition process. The film thickness of the first insulation layer 23 may need to meet the relevant requirements for the thickness of the gate insulation layer of the thin film transistor. The parameters such as the film thickness may be set by, for example, adjusting the relevant process parameters. The first insulating layer may include silicon oxide, silicon nitride, photoresist, organic polymer material, or the like.

On the basis of the intermediate product obtained after the above step 103, the above step 104 may include a process of patterning the first insulating layer 23 to etch a part of the first insulating layer 23 corresponding to the via hole H2, so as to form the via hole H2 as shown in FIGS. 2 and 3. In the case where the first insulating layer is formed of a photoresist, the via hole may be formed directly by exposure and development of the photoresist without the necessity of forming the photoresist that is used as a mask.

On the basis of the intermediate product obtained after the above step 104, the above step 105 may include a process of depositing a layer of transparent conductive material and patterning the layer of transparent conductive material to form the first transparent conductive layer 24 as shown in FIG. 2 and FIG. 3. In the present embodiment, the transparent conductive material may include, for example, a material that satisfies the application requirements for the light transmission and the conductivity such as indium tin oxide (ITO).

It should be understood that, since the array substrate may further include other structures not shown in FIG. 2 and FIG. 3, other processes not described may also be included before, after, or between the steps. For example, an insulating layer covered on the first transparent conductive layer 24 can be formed through a corresponding step after step 105. For example, transparent conductive wirings disposed in the same layer as the first transparent conductive layer 24 can be formed in the same patterning process of transparent conductive material, which is not limited thereto.

It should also be understood that other via holes may also be formed during the formation of the via hole, and the via holes may have different depths from each other. For example, the via hole penetrating the gate insulation layer 27 and the first insulation layer 23 may apparently have a depth larger than that of the via hole H2. In this example, the via hole H2 is bound to have the problem of over-etching as described above. In order to complete the formation of via holes penetrating the gate insulation layer 27 and first insulating layer 23, after the via hole H2 has been formed and the surface of the pad layer 22 has been exposed, the etching will continue for a period of time during which the pad layer 22 will be affected by the undesired etching. As described above, however, since the transparent conductive material is substantially more resistant to etching than the metallic material, the adverse effect caused by this unexpected etching in comparison to the metallic electrode layer 21 can be greatly reduced.

Figure 5:
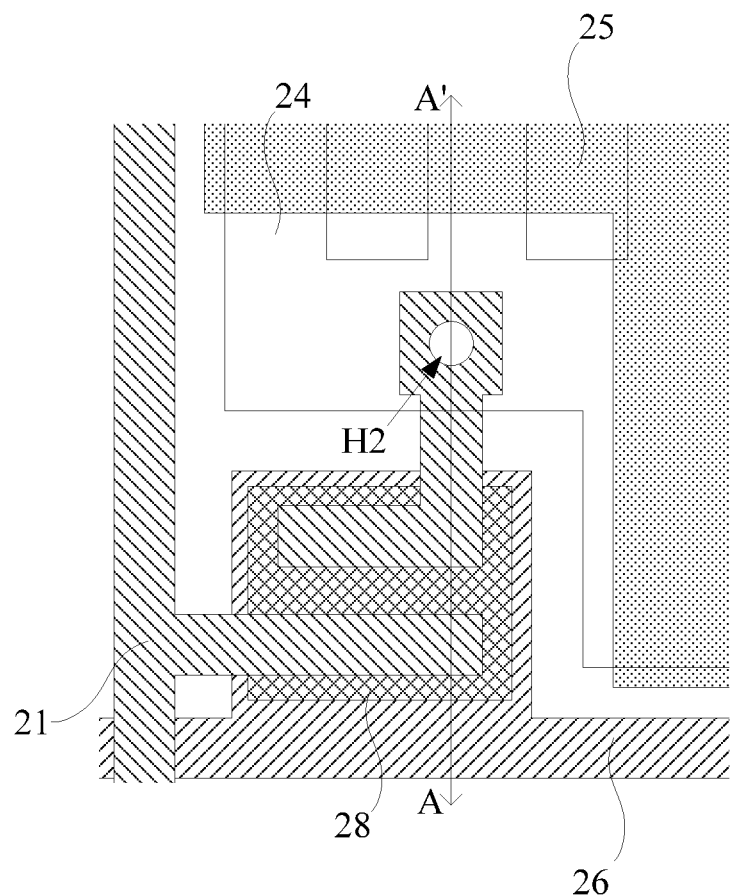
FIG. 5 is a plan structural view of an array substrate provided in a comparative embodiment of the present disclosure.
Figure 6:
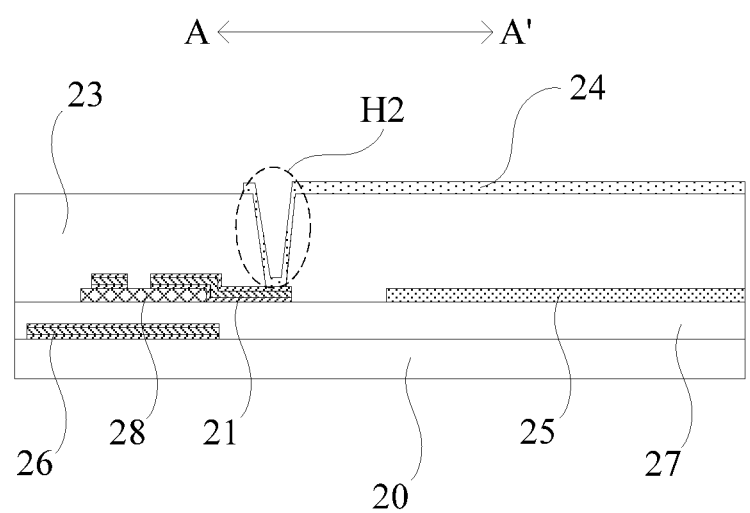
FIG. 6 is a cross sectional view taken along A-A' of the array substrate illustrated in FIG. 5.

In a comparative example, the array substrate has a structure as shown in FIGS. 5 and 6. Referring to FIGS. 5 and 6, the only difference from the array substrate shown in FIG. 2 and FIG. 3 is that the pad layer 22 is not disposed, while the first transparent conductive layer 24 is directly connected to the metal electrode layer 21 through the via hole H2. It is understandable that in the manufacturing process of the array substrate of the comparative example, the above-mentioned undesired etching during the etching for forming the via hole H2 will directly act on the metal electrode layer 21. In this way, due to the poor etch resistance of the metal material, the above-mentioned undesired etching may form a large recess in the metal electrode layer 21, that is, the thickness of the metal electrode layer 21 at the bottom of the via hole H2 will be much smaller than the thickness of the metal electrode layer 21 at other positions. Moreover, the upper protection layer of the metal electrode layer 21 may be penetrated, and the surface of the conductive layer exposed to the ambient environment may undergo surface oxidation. Therefore, the contact resistance between the first transparent conductive layer 24 and the metal electrode layer 21 after the first transparent conductive layer 24 is formed may have a large resistance value, or may even approximate to an open circuit, thereby seriously affecting the realization of the desired function. In addition, atoms in the conductive layer may diffuse from the damaged portion of the upper protection layer to the periphery, causing various problems that may cause product failure or performance degradation.

One of the means that can be alleviated for the above mentioned problems is to increase the thickness of the upper protection layer of the metal electrode layer 21, i.e., by sacrificing a portion of the upper protection layer at the bottom of the via hole according to the extent of over etching, the serious problems due to the exposure of the conductive layer may be prevented. However, the above means results in not only increasing the consumption of the target material of the upper protection material and the time for forming the film, but also increasing the overall thickness of the substrate and steps in the structure over the protection layer, thereby causing various problems regarding cost, the productivity and element performance.

As can be seen by comparing the comparative examples and the embodiments of the present disclosure, the pad layer 22 can be less damaged than the metal electrode layer 21 under the same degree of etching, and the stable transparent conductive material does not cause problems such as oxidation of the conductive layer. The first transparent conductive layer 24 and the pad layer 22 can also obtain a very small contact resistance by the contact of the same material. The increase of the resistance caused by the greater resistivity of the transparent conductive material can also be limited within a sufficiently small range by designing the size of the pad layer 22. In addition, the pad layer 22 can also make good electrical contact with the metal electrode layer 21 under the blockage of the first insulating layer 23. In summary, the embodiments of the present disclosure can prevent the adverse effects of over-etching and achieve better resistance characteristics under the same conditions. Compared with the above method of increasing the thickness of the upper protection layer, the embodiments of the present disclosure may reduce the consumption of the target material and the time for forming the film, and reduce the overall thickness of the substrate and steps in the structure over the upper protection layer, thereby having advantages regarding cost, the productivity and element performance.

According to an aspect of the embodiment of the present disclosure, the array substrate further includes a second transparent conductive layer. The first insulating layer covers on the second transparent conductive layer. The pad layer and the second transparent conductive layer are formed in one patterning process of the same transparent conductive material. According to the above design, it is possible to avoid the increase of the process for additionally forming the pad layer, but only by changing the pattern of the mask plate of the second transparent conductive layer, which facilitates the simplification the process and reduction the cost.

In another aspect of the embodiment of the present disclosure, with respect to the positional relation between the metal electrode layer and the via hole, the array substrate illustrated in FIG. 1 has an arrangement in which the metal electrode layer is disposed in the region outside of the region in which the via hole is disposed. Accordingly, the first transparent conductive layer is connected to the metal electrode layer through the pad layer disposed between the via hole and the metal electrode layer. The array substrate shown in FIG. 2 and FIG. 3 involves the arrangement in which the via hole is disposed in the region within the region in which the metal electrode layer is disposed, such that the first transparent conductive layer is connected to the metal electrode layer through the pad layer disposed beneath the via hole. Comparing the above arrangements, it is obvious that the latter can achieve a smaller resistance value than the former with respect to the connection between the first transparent conductive layer and the metal electrode layer; while by virtue of the light transmission property of the pad layer, the former is more advantageous for increasing the pixel aperture ratio than the latter. Based on this, in the implementation of the application, it is possible to select either of the above arrangements according to the application requirements.

Figure 7:
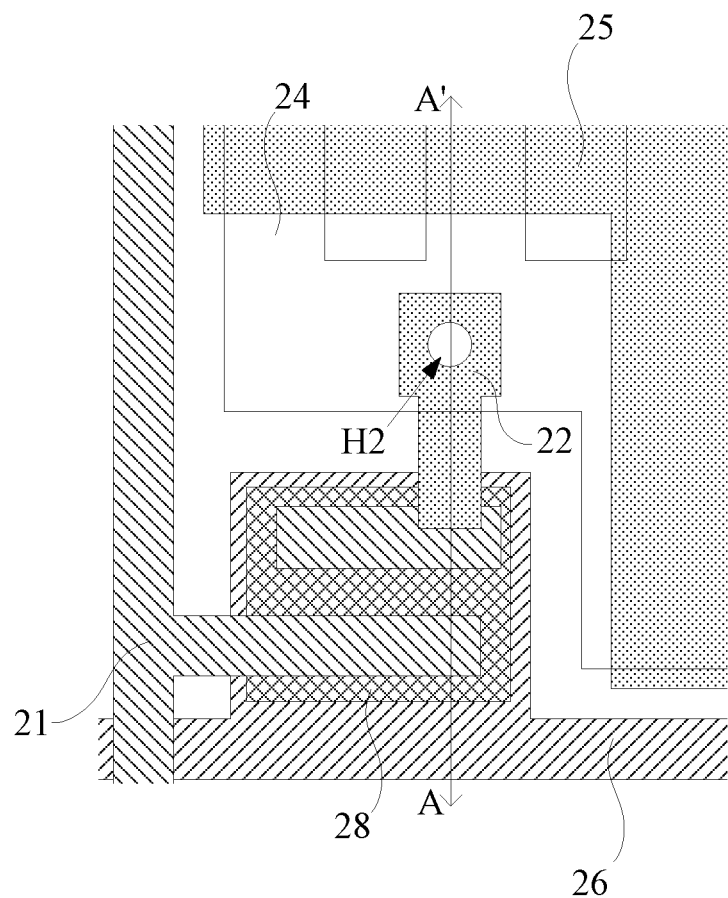
FIG. 7 is a plan structural view of an array substrate provided in a further embodiment of the present disclosure.
Figure 8:
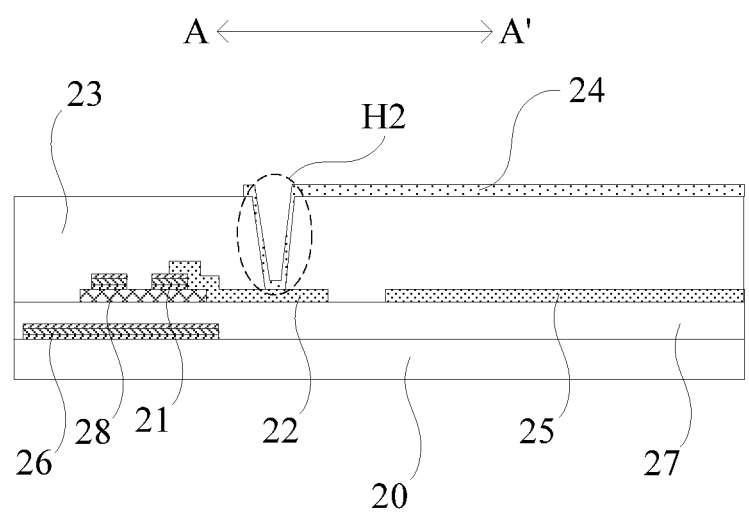
FIG. 8 is a cross sectional view taken along A-A' of the array substrate illustrated in FIG. 7.

In one example, the positional relationship between the metal electrode layer and the via hole is as shown in FIGS. 7 and 8. Referring to FIGS. 7 and 8, in the array substrate shown therein, the metal electrode layer 21 (the drain pattern of the thin film transistor) is disposed not only outside the region where the via hole H2 is disposed but also outside the region where the first transparent conductive layer 24 (the pattern of the pixel electrode) is disposed, such that the first transparent conductive layer 24 (the pattern of the pixel electrode) is connected to the metal electrode layer 21 (the drain pattern of the thin film transistor) through the pad layer 22 disposed between the first transparent conductive layer 24 (the pattern of the pixel electrode) and the metal electrode layer 21 (the drain of the thin film transistor). Based on this, no metal layer that blocks the light is disposed in the area where the first transparent conductive layer 24 is disposed, and the aperture ratio of the pixel of the array substrate is increased, which may achieve a better display effect.

In still another aspect of the embodiment of the present disclosure, in an array substrate having an LC display mode such as an In-Plane Switching (IPS) mode, an Advanced Super Dimension Switch (ADS), a High Aperture Advanced Super Dimensional Switch (HADS) mode or a Fringe Field Switching (FFS) mode, the arrangement of the pixel electrode and the common electrode of the array substrates may be different from the above arrangements, while the present disclosure may also be applied in these array substrates.

Figure 9:
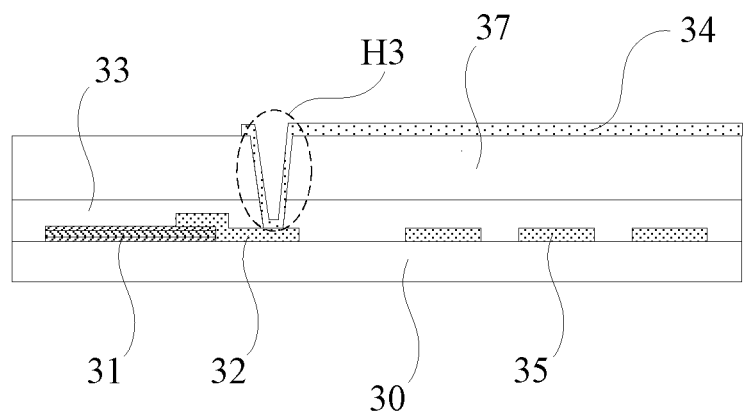
FIG. 9 is cross sectional view of an array substrate provided in a further embodiment of the present disclosure.

FIG. 9 is cross sectional view of an array substrate provided in a further embodiment of the present disclosure. Referring to FIG. 9, the array substrate in this embodiment includes a metal electrode layer 31, a pad layer 32, a first insulating layer including a gate insulating layer 33 and a passivation layer 37, and a first transparent conductive layer 34 and a second transparent conductive layer 35. In the present embodiment, the metal electrode layer 31 includes a conductive layer and a lower protection layer and an upper protection layer respectively located on the two surfaces of the conductive layer. The conductive layer, the lower protection layer and the upper protection layer may include metal materials. The pad layer 32 includes a transparent conductive material, and the pad layer 32 is connected to the metal electrode layer 31. The first insulating layer (gate insulating layer 33) is covered on the metal electrode layer 31, the pad layer 32 and the second transparent conductive layer 35, and the first transparent conductive layer 34 is disposed on the first insulating layer (passivation layer 37). The first insulating layer (the gate insulating layer 33 and the passivation layer 37) is provided with a via hole H3, and the first transparent conductive layer 34 is connected to the pad layer 32 through the via hole H3. It should be understood that the pad layer 32 formed of a transparent conductive material is respectively connected to the first transparent conductive layer 34 and the metal electrode layer 31 so as to form the electrical connection between the first transparent conductive layer 34 and the metal electrode layer 31.

As illustrated in FIG. 9, a portion of the metal layer 31 is a common voltage line for connecting a common voltage, a portion of the first transparent conductive layer 34 is a pattern of a common electrode, and a portion of the second transparent conductive layer 35 is a pattern of a pixel electrode. That is, the present embodiment avoids over-etching the common voltage line during the formation of the via hole H3 by simultaneously forming the pad layer 32 corresponding to the via hole H3 in the patterning process of the transparent conductive material forming the common electrode.

Not shown in FIG. 9, the metal electrode layer 31 further includes a gate electrode. The array substrate further includes a source/drain conductive layer and an active layer between the gate insulating layer 33 and the passivation layer 37. In the embodiment, the active layer and the gate electrode overlap with each other, and there is a connection between the source/drain conductive layer and the active layer. The passivation layer 37 covers on the gate insulating layer 33, the source/drain conductive layer and the active layer, thereby forming the structure of the thin film transistor shown in FIG. 3.

As can be seen from the comparison, the passivation layer 37 of the present embodiment is similar to the first insulating layer 23 of the previous embodiments, the gate insulating layer 33 is similar to the gate insulating layer 27 of the previous embodiments, the metal electrode layer 31 is similar to the gate conductive layer 26 of the previous embodiments, and the source/drain conductive layer is similar to the metal electrode layer 21 of the previous embodiments, thereby realizing an array substrate having a different liquid crystal display mode from the array substrate shown above.

It should be understood that the array substrate shown in FIG. 9 can also be obtained by the manufacturing method shown in FIG. 4, and for a specific process, reference may be made to the foregoing manufacturing method examples, and details are not described herein again.

Figure 10:
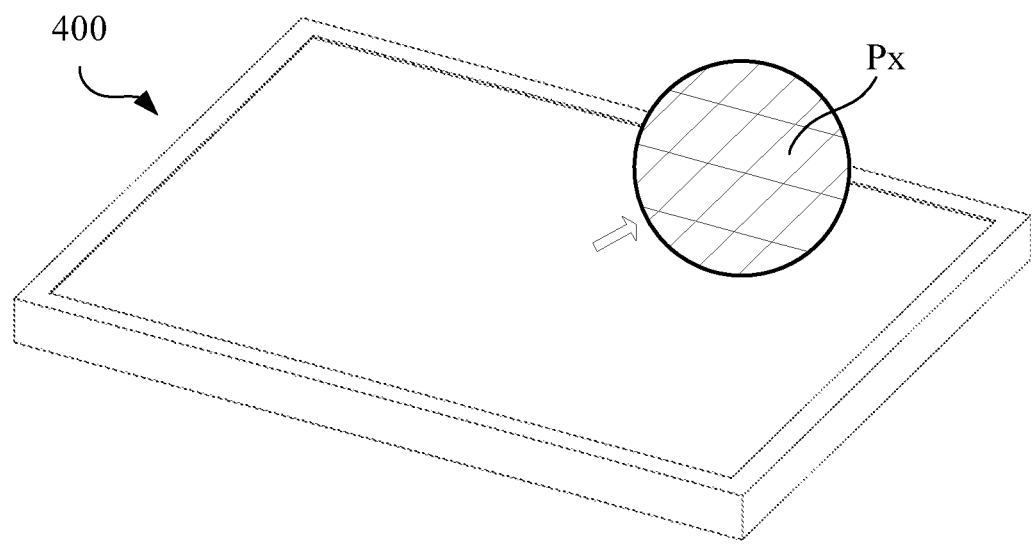
FIG. 10 is a structural view of a display device according to an embodiment of the present disclosure.

Based on a similar inventive concept, embodiments of the present disclosure provide a display device including any one of the above the array substrates. The display device in the embodiments of the present disclosure may be any product or component having a display function such as a display panel, a mobile phone, a tablet, a television, a display, a notebook computer, a digital photo frame, a navigator and the like. As an example, FIG. 10 is a schematic structural diagram of a display device according to an embodiment of the present disclosure. The display device 400 includes any one of the above-mentioned array substrates, a color filter substrate opposite to the array substrate, and a liquid crystal layer formed between the array substrate and the color filter substrate in a cell-forming process. Referring to FIG. 10, the display device 400 includes sub-pixel units Px arranged in rows and columns in the display area. The pixel electrodes and the common electrodes in the array substrate may generate an electric field for controlling the orientation of the liquid crystal, thereby adjusting the display gray scale of the sub-pixel Px by the voltages on the gate lines and the data lines.

As can be seen, since the display device includes any one of the array substrates described above, the embodiments of the present disclosure can solve the problem that in the display device having the copper or aluminum electrode, the electrode protection layer is usually severely damaged in via hole etching, and the required thickness of the protection layer can be significantly reduced, thereby avoiding the formation of large contact resistance, improving cost saving and productivity, and achieving better product performance.

According to the present disclosure, it can be seen from the above technical solution that the pad layer formed by the transparent conductive material in the array substrate can achieve the electrical connection between the first transparent conductive layer and the metal electrode layer, and can block the etching solution from contacting the protection layer at the bottom of the via hole. Therefore, it can solve the problem that in the display device having the copper or aluminum electrode, the electrode protection layer is usually severely damaged in via hole etching. Accordingly, in the present disclosure, the required thickness of the protection layer can be drastically reduced, thereby avoiding the formation of large contact resistance, improving cost saving and productivity, and achieving better product performance.

The foregoing is only the embodiments of the present disclosure, which is not intended to limit the present disclosure. Any modifications, equivalent substitutions and improvements made within the spirit and principle of the present disclosure should be included in the protection scope of the present disclosure.

What is claimed is:

1. An array substrate, comprising a metal electrode layer, a pad layer, a first insulating layer and a first transparent conductive layer, wherein:
    the pad layer comprises a transparent conductive material, the metal electrode layer comprises a conductive layer and protection layers formed on both surfaces of the conductive layer, and the pad layer is connected to the metal electrode layer;
    the first insulating layer is covered on the metal electrode layer and the pad layer, and the first transparent conductive layer is disposed on the first insulating layer; and
    a via hole is provided in the first insulating layer, and the first transparent conductive layer is connected to the pad layer through the via hole.

2. The array substrate according to claim 1, wherein the metal electrode layer is disposed in a first region outside of a second region in which the via hole is disposed, and the first transparent conductive layer is connected to the metal electrode layer through the pad layer disposed between the via hole and the metal electrode layer.

3. The array substrate according to claim 1, wherein the metal electrode layer is disposed in a first region outside of a third region in which the first transparent conductive layer is disposed, and the first transparent conductive layer is connected to the metal electrode layer through the pad layer disposed between the first transparent conductive layer and the metal electrode layer.

4. The array substrate according to claim 1, wherein the via hole is disposed in a second region within a first region in which the metal electrode layer is disposed, and the first transparent conductive layer is connected to the metal electrode layer through the pad layer disposed beneath the via hole.

5. The array substrate according to claim 1, further comprising a second transparent conductive layer, the first insulating layer is covered on the second transparent conductive layer, and the pad layer and the second transparent conductive layer are formed in one patterning process.

6. The array substrate according to claim 5, further comprising a gate conducive layer, a gate insulating layer and an active layer;
    the metal electrode layer is connected to the active layer, and all of the metal electrode layer, the active layer and the second transparent conductive layer are disposed on the gate insulating layer; and
    the gate conductive layer is overlapped with the active layer, and the gate insulating layer is covered on the gate conductive layer.

7. The array substrate according to claim 5, further comprising a source/drain conductive layer and an active layer, the metal electrode layer comprises a common voltage line and a gate electrode, and the first insulating layer comprises a gate insulating layer and a passivation layer;
    the common voltage line is connected to the pad layer, the gate insulating layer is covered on the metal electrode layer, the pad layer and the second transparent conductive layer;
    the active layer is overlapped with the gate electrode, and the source/drain conductive layer is connected to the active layer;
    the passivation layer is covered on the gate insulating layer, the source/drain conductive layer, and the active layer; and
    the first transparent conductive layer is disposed on the passivation layer, a via hole is formed in the gate insulating layer and the passivation layer, and the first transparent conductive layer is connected to the pad layer through the via hole.

8. The array substrate according to claim 1, wherein the conductive layer comprises aluminum, copper, an aluminum-containing alloy or a copper-containing alloy, and the protection layer comprises molybdenum, niobium, a molybdenum-containing alloy or a niobium-containing alloy.

9. A display device comprising an array substrate, the array substrate comprising a metal electrode layer, a pad layer, a first insulating layer and a first transparent conductive layer, wherein:
    the pad layer comprises a transparent conductive material, the metal electrode layer comprises a conductive layer and protection layers formed on both surfaces of the conductive layer, and the pad layer is connected to the metal electrode layer;
    the first insulating layer is covered on the metal electrode layer and the pad layer, and the first transparent conductive layer is disposed on the first insulating layer; and
    a via hole is provided in the first insulating layer, and the first transparent conductive layer is connected to the pad layer through the via hole.

10. The display device according to claim 9, wherein the metal electrode layer is disposed in a first region outside of a second region in which the via hole is disposed, and the first transparent conductive layer is connected to the metal electrode layer through the pad layer disposed between the via hole and the metal electrode layer.

11. The display device according to claim 9, wherein the metal electrode layer is disposed in a first region outside of a third region in which the first transparent conductive layer is disposed, and the first transparent conductive layer is connected to the metal electrode layer through the pad layer disposed between the first transparent conductive layer and the metal electrode layer.

12. The display device according to claim 9, wherein the via hole is disposed in a second region within a first region in which the metal electrode layer is disposed, and the first transparent conductive layer is connected to the metal electrode layer through the pad layer disposed beneath the via hole.

13. The display device according to claim 9, wherein the array substrate further comprises a second transparent conductive layer, the first insulating layer is covered on the second transparent conductive layer, and the pad layer and the second transparent conductive layer are formed in one patterning process.

14. The display device according to claim 13, wherein the array substrate further comprises a gate conducive layer, a gate insulating layer and an active layer;

the metal electrode layer is connected to the active layer, and all of the metal electrode layer, the active layer and the second transparent conductive layer are disposed on the gate insulating layer; and the gate conductive layer is overlapped with the active layer, and the gate insulating layer is covered on the gate conductive layer.

15. The display device according to claim 13, wherein the array substrate further comprises a source/drain conductive layer and an active layer, the metal electrode layer comprises a common voltage line and a gate electrode, and the first insulating layer comprises a gate insulating layer and a passivation layer;

the common voltage line is connected to the pad layer, the gate insulating layer is covered on the metal electrode layer, the pad layer and the second transparent conductive layer;

the active layer is overlapped with the gate electrode, and the source/drain conductive layer is connected to the active layer;

the passivation layer is covered on the gate insulating layer, the source/drain conductive layer, and the active layer; and the first transparent conductive layer is disposed on the passivation layer, a via hole is formed in the gate insulating layer and the passivation layer, and the first transparent conductive layer is connected to the pad layer through the via hole.

16. The display device according to claim 9, wherein the conductive layer comprises aluminum, copper, an aluminum-containing alloy or a copper-containing alloy, and the protection layer comprises molybdenum, niobium, a molybdenum-containing alloy or a niobium-containing alloy.

* * * * *